United States Patent
Ryu et al.

(10) Patent No.: US 6,538,956 B2
(45) Date of Patent: Mar. 25, 2003

(54) SEMICONDUCTOR MEMORY DEVICE FOR PROVIDING ADDRESS ACCESS TIME AND DATA ACCESS TIME AT A HIGH SPEED

(75) Inventors: Je-Hun Ryu, Kyoungki-do (KR); Jong-Hee Han, Kyoungki-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/867,811

(22) Filed: May 30, 2001

(65) Prior Publication Data

US 2002/0001240 A1 Jan. 3, 2002

(30) Foreign Application Priority Data

May 31, 2000 (KR) ........................................ 2000-29645

(51) Int. Cl.$^7$ ................................................. G11C 8/00
(52) U.S. Cl. ........................ 365/233; 365/193; 365/194
(58) Field of Search ................................. 365/233, 194, 365/193, 189.01, 230.01

(56) References Cited

U.S. PATENT DOCUMENTS

| | | | |
|---|---|---|---|
| 5,886,946 A | * | 3/1999 | Ooishi .......................... 365/194 |
| 5,930,177 A | * | 7/1999 | Kim .......................... 365/189.05 |
| 6,031,788 A | * | 2/2000 | Bando et al. ........... 365/230.08 |
| 6,215,726 B1 | | 4/2001 | Kubo ............................. 365/233 |
| 6,278,303 B1 | * | 8/2001 | Nakanishi et al. ........... 327/142 |

FOREIGN PATENT DOCUMENTS

GB    2 345 395    7/2000

OTHER PUBLICATIONS

Great Britain Search Report, dated Feb. 13, 2002, application No. GB 0113270.3.

* cited by examiner

*Primary Examiner*—Hoai Ho
(74) *Attorney, Agent, or Firm*—Marshall, Gerstein & Borun

(57) ABSTRACT

A semiconductor memory device for performing highspeed address access and highspeed data access is provided by controlling a control/address block in synchronization with a delay locked loop (DLL) clock. The semiconductor memory device includes a clock buffer for buffering an external clock; a delay locked loop (DLL) for generating a DLL clock in synchronization with the external clock; a control signal buffer for receiving and buffering an external control signal to generate an internal control signal in synchronization with the DLL clock; and an address buffer for receiving and buffering an external address signal to generate an internal address signal in synchronization with the DLL clock.

12 Claims, 8 Drawing Sheets

SEMICONDUCTOR MEMORY DEVICE FOR PROVIDING ADDRESS ACCESS TIME AND DATA ACCESS TIME AT A HIGH SPEED

FIELD OF THE INVENTION

The present invention relates to a semiconductor memory device, and, more particularly, to a semiconductor memory device for providing highspeed address access and highspeed data access.

BACKGROUND OF THE INVENTION

For achieving high-speed operation in a semiconductor memory device, a synchronous dynamic random access memory (SDRAM) has been developed. The SDRAM operates in synchronization with an external clock signal. The SDRAM includes a single data rate (SDR) SDRAM, a double data rate (DDR) SDRAM, and the like.

Referring to FIG. 1, the conventional semiconductor memory device includes a clock buffer and generator 100, a control/address block 110 having a control signal buffer 111 and an address buffer 112, and a command decoder 120. The clock buffer and generator 100 receives an external clock EXT_CLK to generate an internal clock INT_CLK, which is inputted into the control signal buffer 111 and into the address buffer 112. The control signal buffer 111 receives a control signal CNTL to generate a buffered control signal BUF_CNTL in synchronization with the internal clock INT_CLK. The command decoder 120 decodes the buffered control signal BUF_CNTL to output a command signal CMD. In the same manner, the address buffer 112 receives an address signal ADDR to generate a buffered address signal BUF_ADDR in synchronization with the internal clock INT_CLK.

As shown in FIG. 2, the skew between the external clock EXT_CLK and the internal clock INT_CLK is about 1.5 nanoseconds. That is, the rising edge of the internal clock INT_CLK is generated 1.5 nanoseconds following the rising edge of the external clock EXT_CLK. This causes the command signal CMD to also have a time delay corresponding to the skew. As a result, both the address access time (tAA) and the data access time (tAC) of the semiconductor memory device are reduced.

SUMMARY OF THE INVENTION

In accordance with an aspect of the invention, there is provided a semiconductor memory device comprising: a clock buffer for buffering an external clock; a delay locked loop (DLL) for generating a DLL clock in substantial synchronization with the external clock; a control signal buffer for receiving and buffering an external control signal to generate an internal control signal in substantial synchronization with the DLL clock; and an address or CAS buffer for receiving and buffering an external address or CAS signal to generate an internal address or CAS signal in substantial synchronization with the DLL clock.

In accordance with another aspect of the invention, there is provided a semiconductor memory device comprising: a clock control unit for receiving a delay locked loop (DLL) disable signal, a DLL reset signal, a power-up signal, a self-refresh request signal and a self-refresh signal to generate a DLL control signal and a clock selection signal; a clock generation unit for receiving an external clock and the power-up signal to generate an internal clock; a DLL clock buffer unit for generating a DLL clock using the external clock; a column address strobe (CAS) buffer unit for receiving and buffering the DLL control signal, an external CAS signal and a reference voltage signal to generate an internal CAS signal and an inverted internal CAS signal; and a CAS latch unit for receiving and latching the internal CAS signal, the inverted internal CAS signal, the internal clock, the DLL clock, the DLL control signal, the external CAS signal and the reference voltage signal to generate a final CAS signal and an inverted final CAS signal.

In accordance with still another aspect of the invention, there is provided a method of propagating a signal through a semiconductor memory device. The method comprises the steps of: providing an external clock; buffering the external clock; generating a delay locked loop (DLL) clock in substantial synchronization with the external clock; and providing the DLL clock to a control signal buffer and an address buffer.

BRIEF DESCRIPTION OF THE DRAWINGS

Exemplary devices and methods will now be described with reference to the accompanying drawings, wherein.

DETAILED DESCRIPTION OF THE PREFERRED EMBODIMENTS

Figure 1:
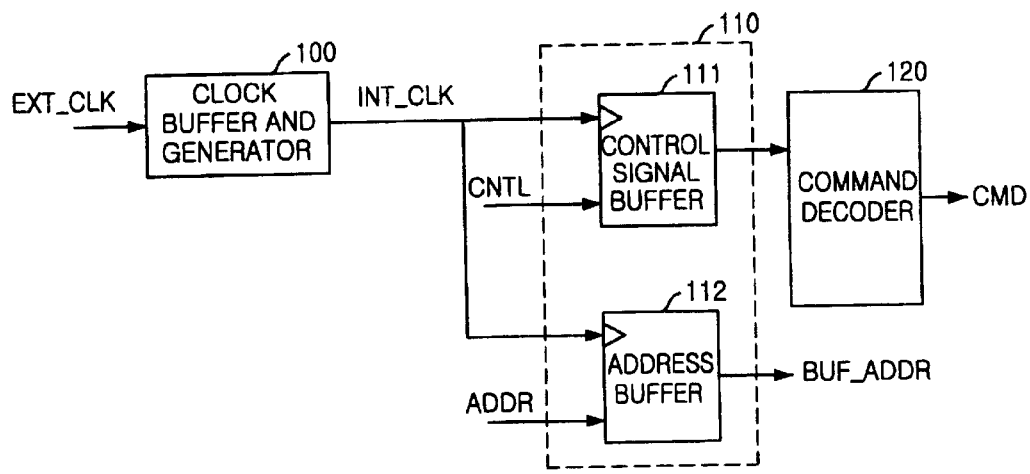
FIG. 1 is a block diagram showing a conventional semiconductor memory device controlled by an internal clock.
Figure 2:
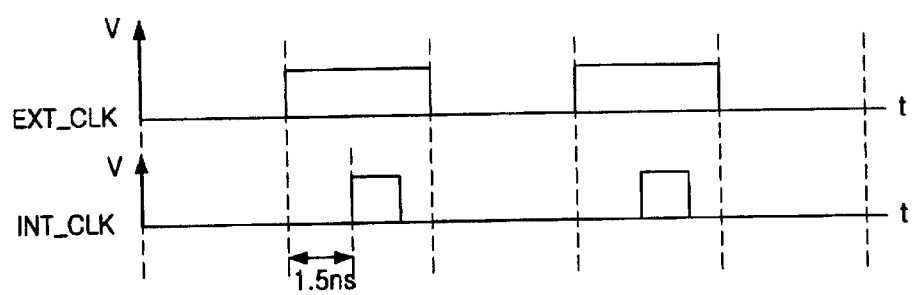
FIG. 2 is a timing chart showing a skew between an external clock and the internal clock in FIG. 1.
Figure 3:
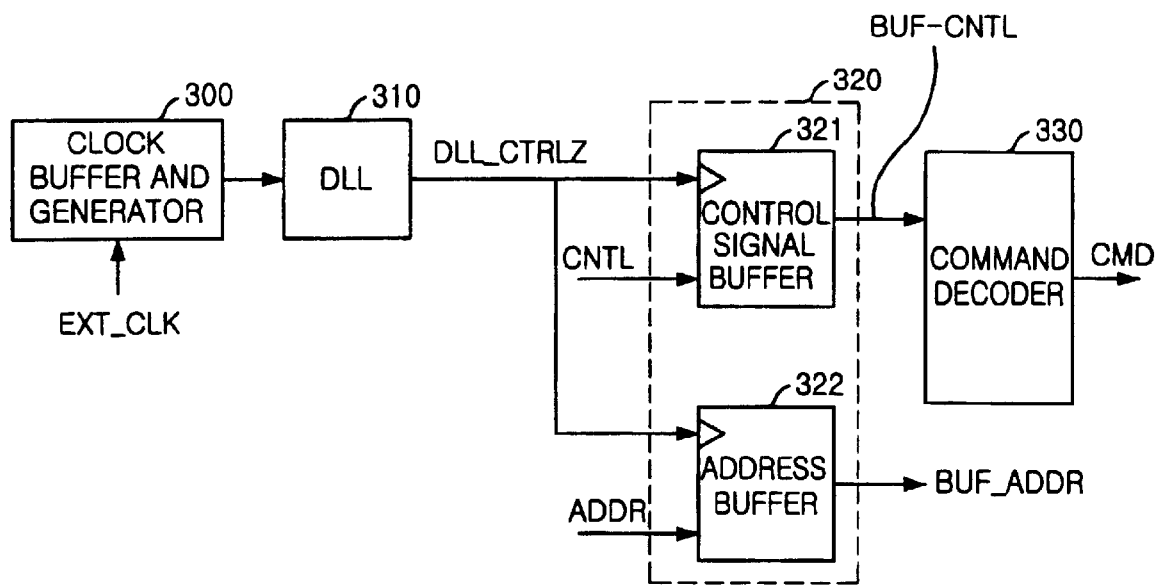
FIG. 3 is a schematic block diagram illustrating an exemplary semiconductor memory device constructed in accordance with the teachings of the invention and controlled by a delay locked loop (DLL) clock.

An exemplary semiconductor memory device constructed in accordance with the teachings of the invention is shown in FIG. 3. The device of FIG. 3 includes a clock buffer and generator 300, a delay locked loop (DLL) buffer 310, a control/address block 320 having a control signal buffer 321 and an address buffer 322, and a command decoder 330.

The clock buffer and generator 300 buffers an external clock EXT_CLK (CLK and CLKZ) to generate a buffered clock CLKP2. A skew exists between the external clock EXT_CLK and the buffered clock. To reduce the skew, the DLL buffer 310 generates a DLL clock DLL_CLK (i.e., a DLL clock signal DLL_CLKP2 which corresponds to the buffered clock CLKP2) and a DLL control signal DLL_CTRLZ. The DLL clock DLL_CLK is almost synchronized with the external clock EXT_CLK as shown in FIG. 4.

The control signal buffer 321 receives and buffers an external control signal CNTLZ to generate an internal control signal. Also, the control signal buffer 321 latches the buffered internal control signal BUF_CNTL and outputs it in synchronization with the DLL clock DLL_CLK. The command decoder 330 decodes the buffered internal control signal BUF_CNTL to output a command signal CMD. The address buffer 322 receives and buffers an external address signal ADDR to generate an internal address signal. Also, the address buffer 322 latches the buffered internal address signal BUF_ADDR and outputs it in synchronization with the DLL clock DLL_CLK.

Figure 4:
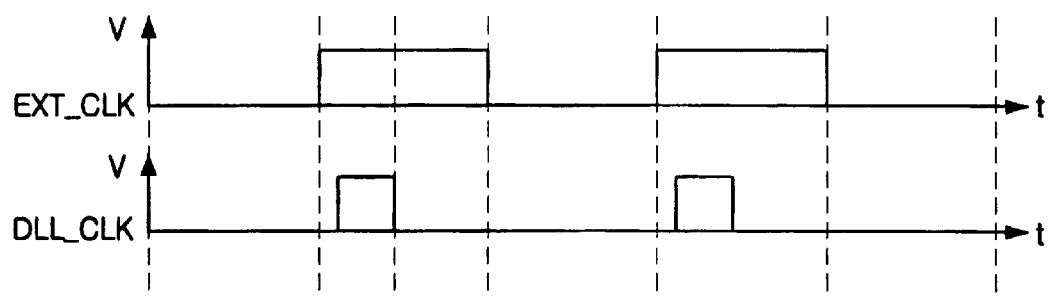
FIG. 4 is a timing chart illustrating a skew between an external clock and the DLL clock in FIG. 3.

FIG. 4 illustrates the relationship between the external clock EXT_CLK and the DLL clock DLL_CLK.

As shown, the DLL clock DLL_CLK is almost synchronized with the external clock EXT_CLK. As a result, since the buffered internal control signal BUF_CNTL and the buffered internal address signal BUF_ADDR are provided to an internal block in synchronization with the DLL clock DLL_CLK, both the address access time and the data access time of the disclosed semiconductor memory device are greatly improved over that of a conventional semiconductor memory device.

The following descriptions and accompanying figures illustrate how the remainder of the disclosed semiconductor memory device responds to the use of the DLL clock DLL_CLK.

Figure 5:
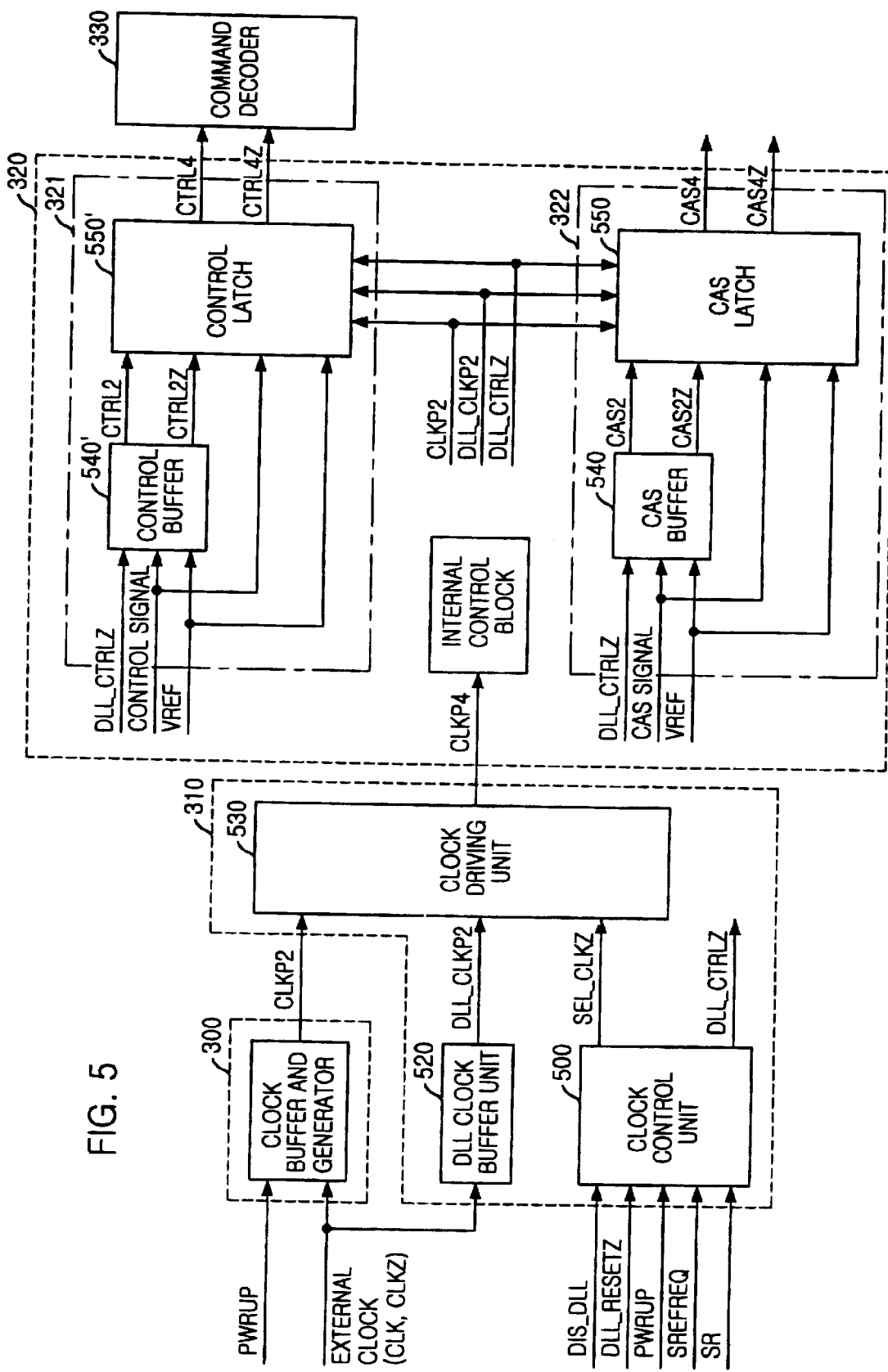
FIG. 5 is a more detailed block diagram of the semiconductor memory device shown in FIG. 3.

FIG. 5 is a more detailed block diagram of the semiconductor memory device in FIG. 3. However, the address buffer 322 in FIG. 3 is replaced with a CAS buffer 540 and a CAS latch 550. This replacement is dependent upon a designer's selection and the intention of showing this replacement is to show that the teachings of the present invention can be applicable to the CAS and/or address signal processing. Hereinafter, the address buffer 322 will be referred to as a CAS buffer 322. Further, since the reference numerals 540' and 550' in the control signal buffer 321 have the same configurations as the reference numerals 540 and 550 in the CAS buffer 322, the remaining description will illustrate only the CAS buffer 322 in more detail. Each of the foregoing will be discussed in greater detail below.

Figure 6:
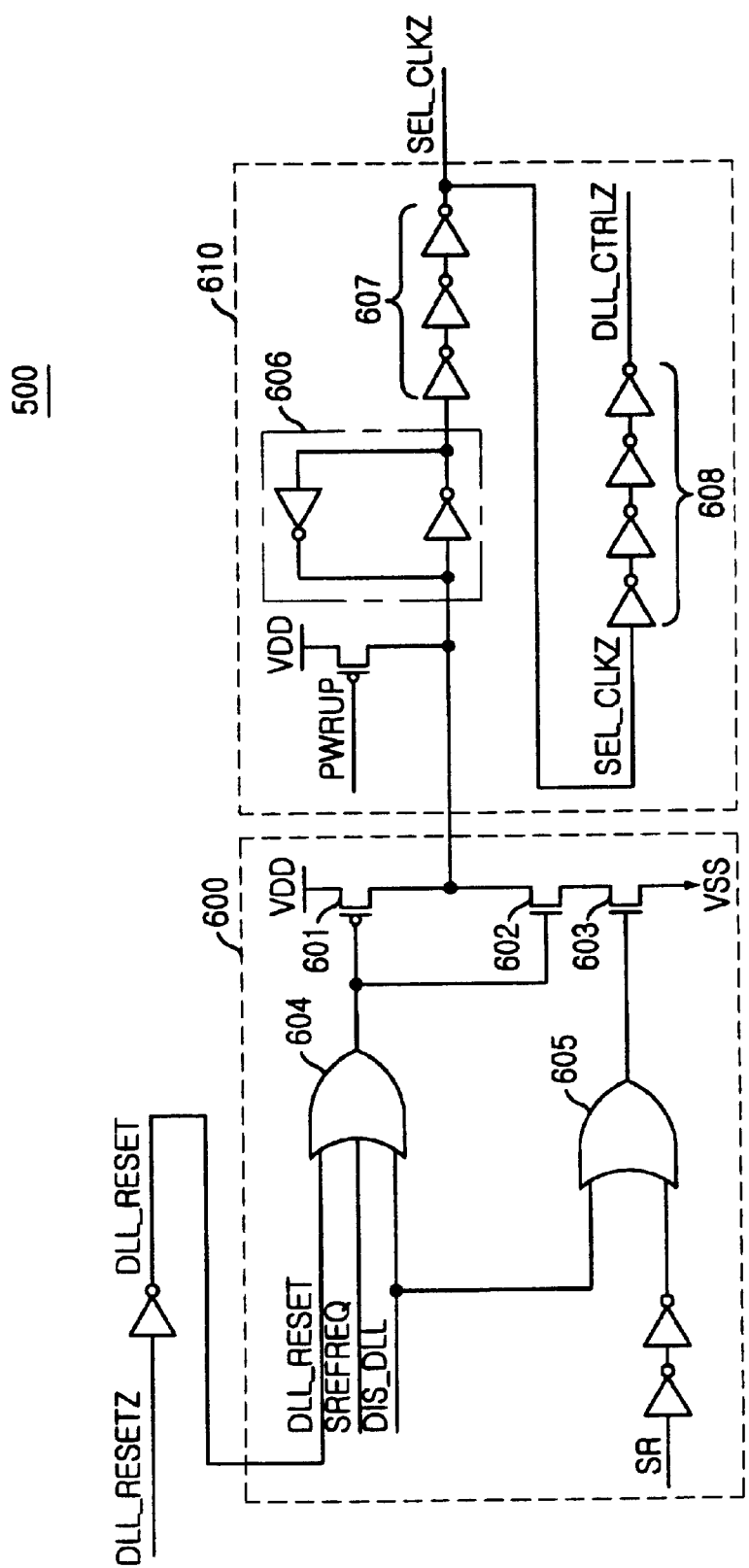
FIG. 6 is a circuit diagram illustrating the clock control unit shown in FIG. 5.

Referring to FIG. 6, the clock control unit 500 receives a DLL disable signal DIS_DLL, a DLL reset signal DLL_RESETZ, a power-up signal PWRUP, a self-refresh request signal SREFREQ, and a self-refresh signal SR to generate a DLL control signal DLL_CTRLZ and a clock selection signal SEL_CLKZ.

The clock control unit 500 includes an input unit 600 and a latch unit 610. The input unit 600 performs a logic combination of the DLL disable signal DIS_DLL, the DLL reset signal DLL_RESETZ, and the self-refresh request signal SREFREQ via an OR gate 604. It also performs a logic combination of the DLL disable signal DIS_DLL, and the self-refresh signal SR via a second OR gate 605. In particular, if any of DLL_RESET, SREFREQ and DIS_DLL is logic high, a first transistor 601 is turned off and a second transistor 602 is turned on via OR gate 604. Also if either DIS_DLL or SR is logic high, a third transistor 603 is switched on via OR gate 603. The states of transistors 601, 602 and 603 determines the output state of the input unit 600. The latch unit 610 latches an output of the input unit 600 in a latch 606 in response to the power-up signal PWRUP, and outputs the clock selection signal SEL_CLKZ via a delay and inverting circuit 607. The DLL control signal DLL_CTRLZ is developed from the clock selection signal SEL_CLKZ via a delay circuit 608.

Figure 7:
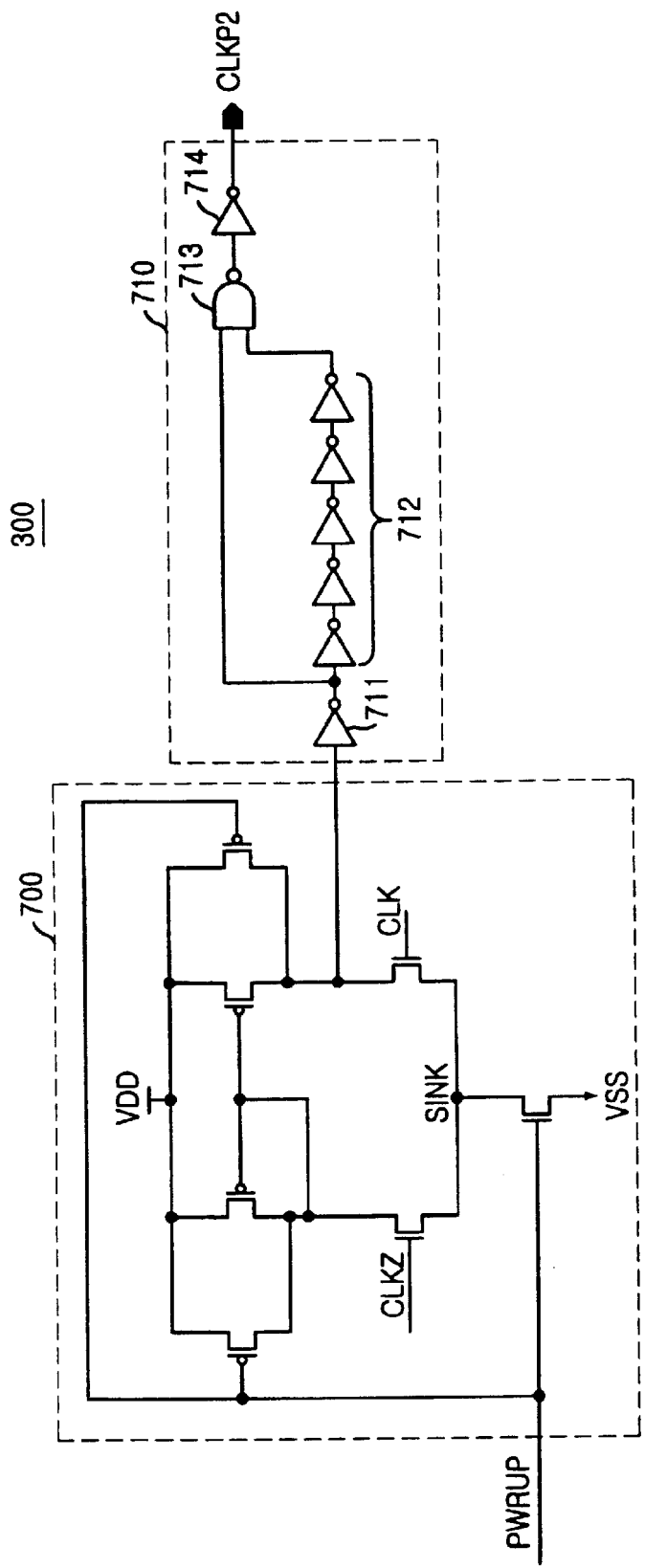
FIG. 7 is a circuit diagram illustrating the clock generation unit shown in FIG. 5.

Referring to FIG. 7, a clock generation unit 300 receives a clock CLK, an inverted clock CLKZ and the power-up signal PWRUP to generate a second clock CLKP2 that is used to control the clock driving unit 530 and the CAS latch unit 550.

More specifically, the clock generation unit 300 includes a buffer unit 700 and a pulse generation unit 710. The buffer unit 700 buffers and amplifies a voltage difference between the clock CLK and the inverted clock CLKZ in response to the power-up signal PWRUP. The buffer unit 700 is implemented with a current mirror type amplifier. The pulse generation unit 710 receives an output of the buffer unit 700 to generate the second clock CLKP2 via an inverter 711, an inverter and delay circuit 712, a NAND gate 713, and an output inverter 714.

In FIG. 5, a DLL clock buffer unit 520 receives the external clock signal and delays and buffers a rising DLL clock RCLK_DLL to generate a second DLL clock DLL_CLKP2. The DLL clock buffer unit 520 is implemented with an even number of inverters forming a delay circuit. The detailed configuration of the DLL clock buffer unit 520 in the circuit of FIG. 5 is the same as that used in other circuits so that the detailed configuration of the DLL clock buffer unit 520 will be omitted.

Figure 8:
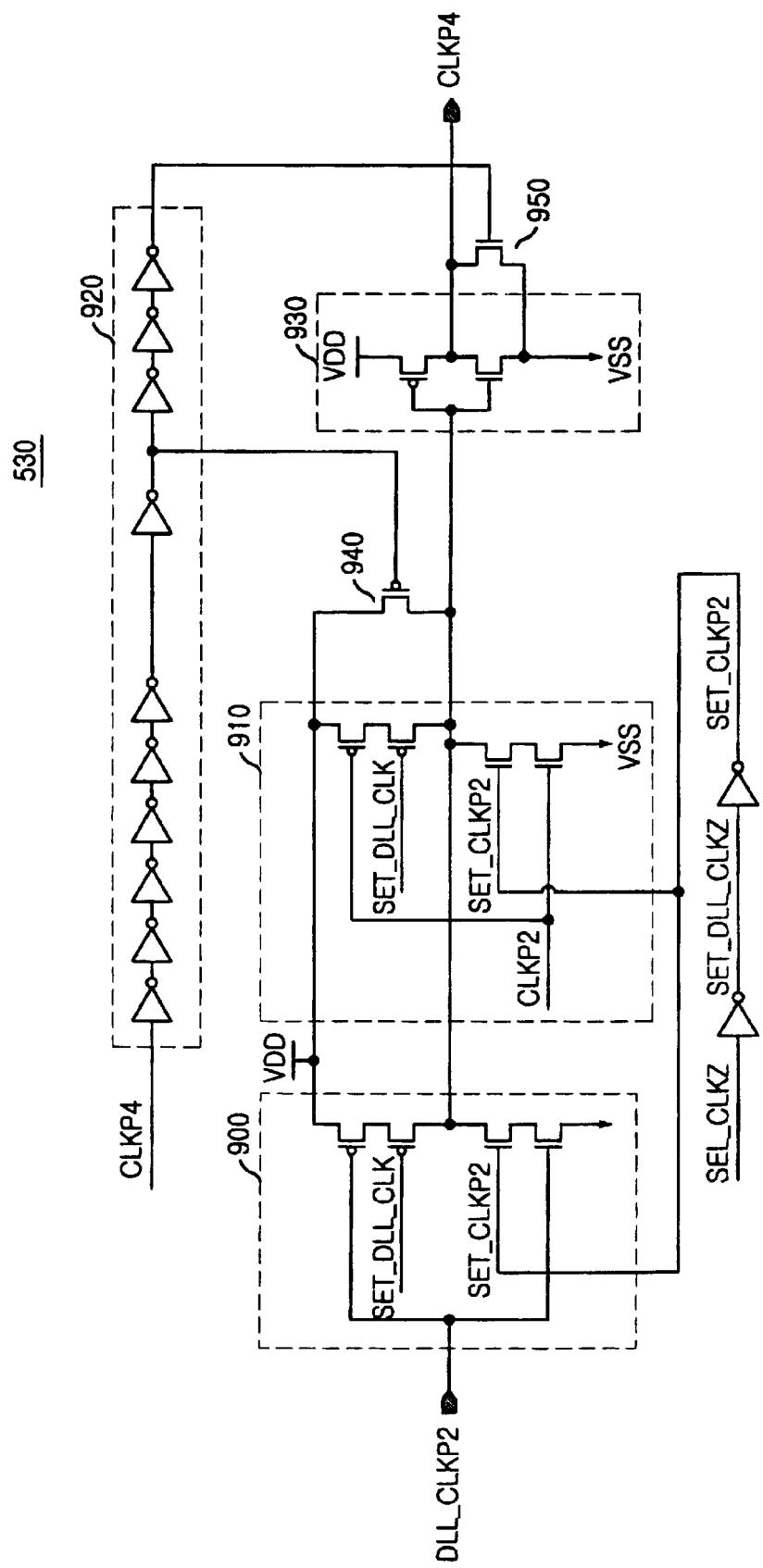
FIG. 8 is a circuit diagram illustrating the clock driving unit shown in FIG. 5.

Referring to FIG. 8, the clock driving unit 530 receives the second clock CLKP2, the second DLL clock DLL_CLKP2 and the clock selection signal SEL_CLKZ to generate a third clock CLKP4.

The clock driving unit 530 includes a first tri-state buffer 900 responsive to the second DLL clock DLL_CLKP2 and the clock selection signal SEL_CLKZ, a second tri-state buffer 910 responsive to the second clock CLKP2 and the clock selection signal SEL_CLKZ, an output unit 930 for receiving an output of the second tri-state buffer 910 to generate the third clock CLKP4, and a delay unit 920 for receiving the third clock CLKP4 to determine the pulse width of the third clock CLKP4. The clock selection signal SEL_CLKZ is inputted to two inverters in series to provide SET_CLKP2 as an input to the first tri-state buffer 900 and to the second tri-state buffer 910. A PMOS transistor 940 is provided to reduce a switching current. For example, if the output signal from the delay unit 920 is in a high voltage level, the output node is in a low voltage level by an NMOS transistor 950 performing a full-down operation. At this time, the PMOS transistor 940 is turned on so that a full-down transistor in the output unit 930 is turned on with a full-down operation. As a result, these two transistors achieve the reduction of current and highspeed switching operation.

Figure 9:
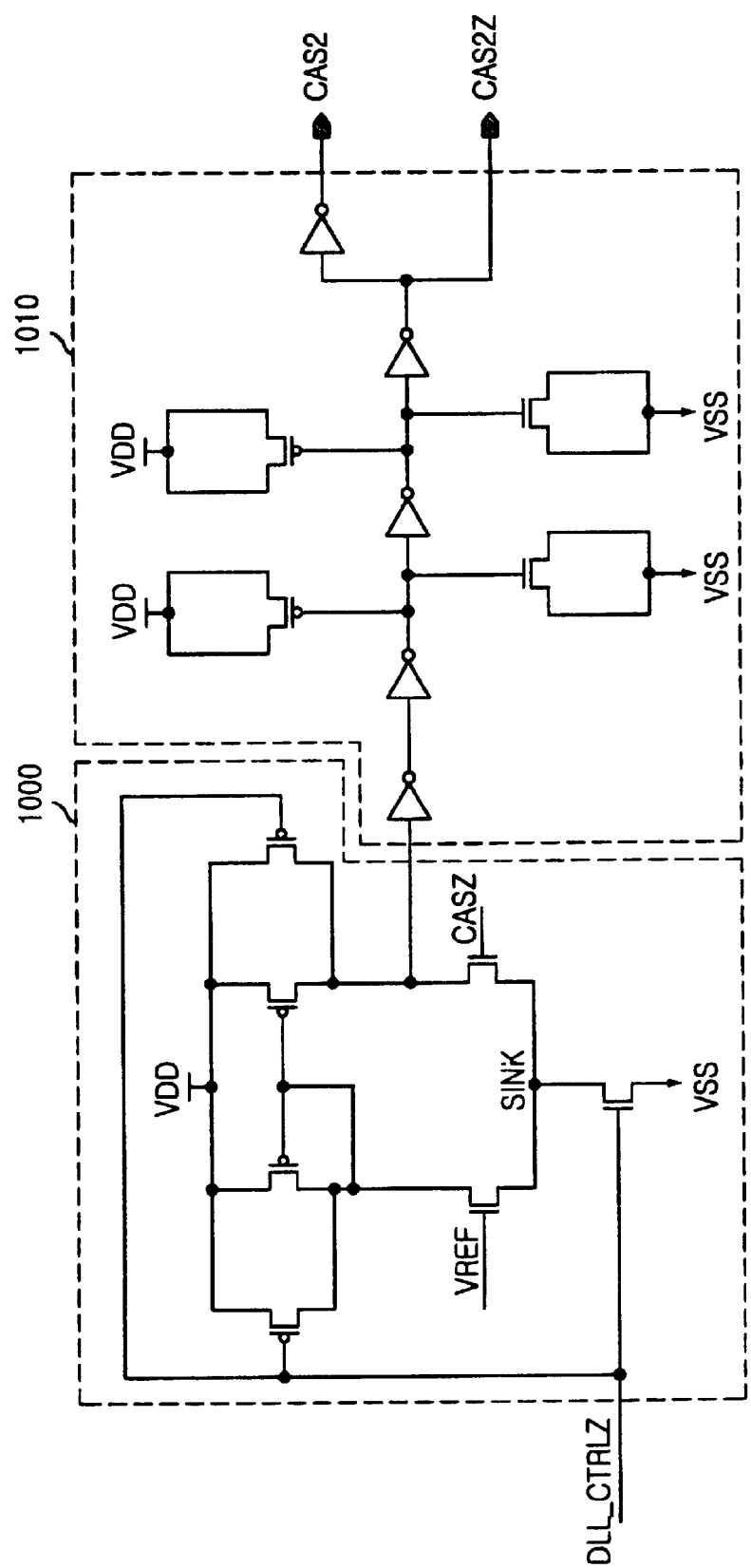
FIG. 9 is a circuit diagram illustrating the column address strobe (CAS) buffer unit shown in FIG. 5.

Referring to FIG. 9, the CAS buffer unit 540 receives and buffers the DLL control signal DLL_CTRLZ, an external CAS signal CASZ and a reference voltage signal VREF to generate an internal CAS signal CAS2 and an inverted internal CAS signal CAS2Z.

The CAS buffer unit 540 includes a buffer unit 1000 for buffering a voltage difference between the reference voltage signal VREF and the external CAS signal CASZ in response to the DLL control signal DLL_CTRLZ, and an output unit 1010 for receiving an output of the buffer unit 1000 to generate the internal CAS signal CAS2 and the inverted internal CAS signal CAS2Z. The buffer unit 1000 is implemented with a current mirror type differential amplifier, and the output unit 1010 is implemented with a plurality of inverters.

Figure 10:
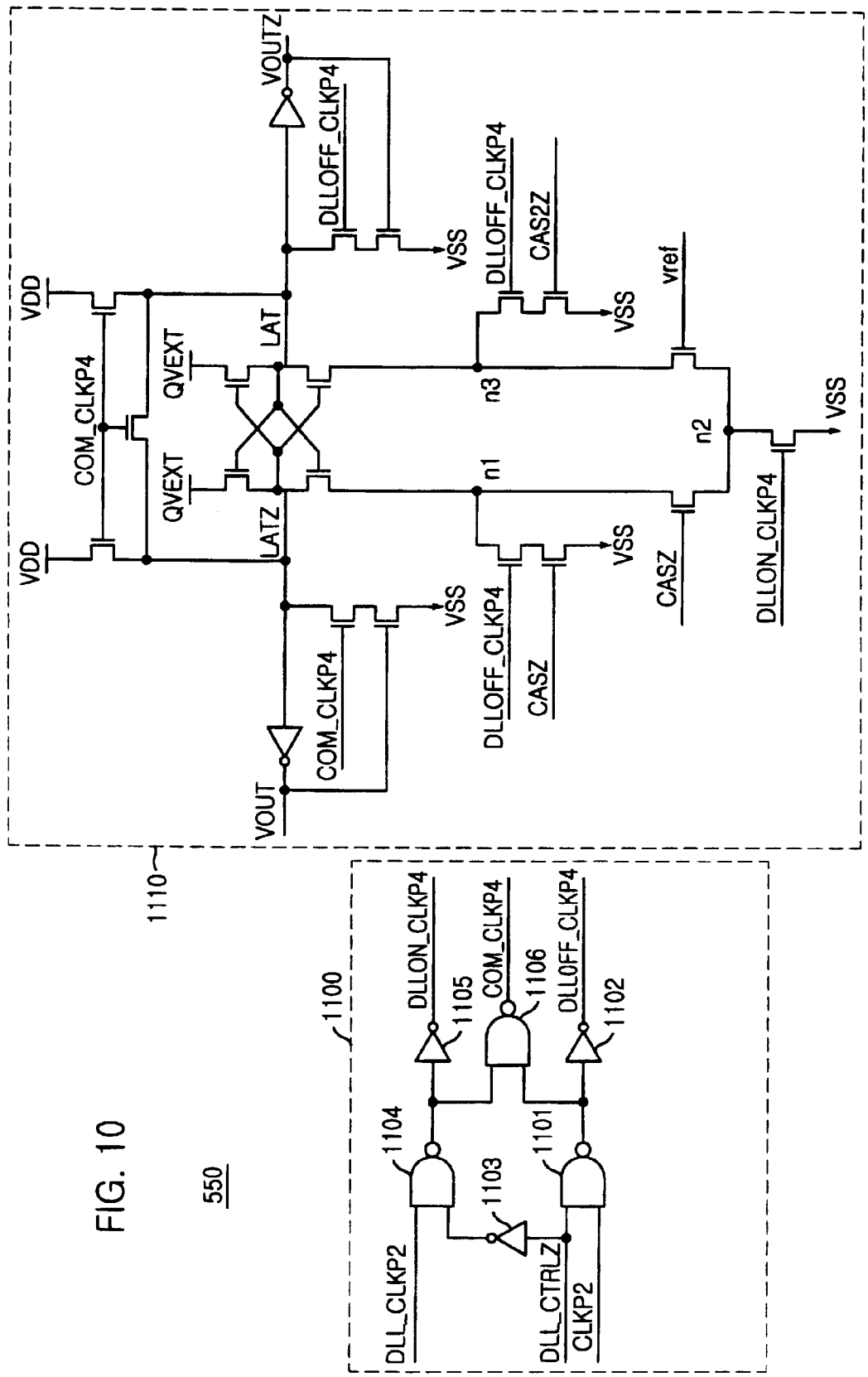
FIG. 10 is a circuit diagram illustrating the CAS latch unit shown in FIG. 5.

Referring to FIG. 10, the CAS latch unit 550 receives and latches the internal CAS signal CAS2, the inverted internal CAS signal CAS2Z, the second clock CLKP2, the second DLL clock DLL_CLKP2, the DLL control signal DLL_CTRLZ, the external CAS signal CASZ, and the reference voltage signal VREF to generate a final CAS signal CAS4 and an inverted final CAS signal CAS4Z.

The CAS latch unit 550 includes a control unit 1100 and a latch unit 1110. The control unit 1100 performs a logic combination on the DLL control signal DLL_CTRLZ, the second DLL clock DLL_CLKP2, and the second clock CLKP2 to generate control signals DLLON_CLKP4, COM_CLKP4 and DLLOFF_CLKP4. In particular, the DLL control signal DLL_CTRLZ and the second clock CLKPZ are inputted to a NAND gate 1101. The control signal DLLOFF_CLKPZ is only in a high state if both the DLL control signal DLL_CTRLZ and the second clock CLKPZ are high.

The control signal DLLDN_CLKPZ is generated by inverting the DLL control signal DLL_CTRLZ via an inverter 1103 and performing a logic operation on the inverted DLL control signal DLL_CTRLZ and the second DLL clock DLL_CLKPZ using a NAND gate 1104. The output of the NAND gate 1104 is inverted by an inverter 1105 to produce the control signal DLLON_CLKP4 which is in a high state only if the second DLL clock DLL_CLKPZ is high and the DLL control signal DLL-CTRLZ is low. The control signal COM_CLKP4 is the result of a NAND logic circuit 1106 operating on the outputs of the NAND gates 1101 and 1104.

The latch unit 1110 receives and latches the control signals DLLON_CLKP4, COM_CLKP4 and DLLOFF_CLKP4, the internal CAS signal CAS2 and the inverted internal CAS signal CAS2Z. The latch unit 1110 can be preferably implemented with a differential amplifier.

From the foregoing, persons of ordinary skill in the art will appreciate that a semiconductor memory device has been provided. The disclosed memory device is capable of providing address access times and data access times at high speeds.

Although preferred examples have been disclosed for illustrative purposes, those of ordinary skill in the art will appreciate that the scope of this patent is not limited thereto. On the contrary, this patent covers all devices and methods falling within the scope and spirit of the accompanying claims.

What is claimed is:

1. A semiconductor memory device comprising:
   a clock buffering and generating unit for buffering an external clock and generating an internal clock;
   a delay locked loop (DLL) for generating a DLL clock in substantial synchronization with the external clock, the DLL including:
      a clock control unit for receiving a DLL signal, a DLL reset signal, a power-up signal, a self-refresh request signal and a self-refresh signal to generate a DLL control signal and a clock selection signal; and
      a DLL clock buffer unit for generating the DLL clock using the external clock;
   a control signal buffer for receiving and buffering an external control signal to generate an internal control signal in substantial synchronization with the DLL clock in response to the DLL control signal; and
   an address or column address strobe (CAS) buffer for receiving and buffering an external address or CAS signal to generate an internal address or CAS signal in substantial synchronization with the DLL clock in response to the DLL control signal.

2. The semiconductor memory device of claim 1 further comprising a command decoder for decoding the internal control signal to generate a command signal.

3. The semiconductor memory device of claim 1, wherein an access time of the semiconductor memory device is below 1.5 nanoseconds.

4. The semiconductor memory device of claim 1, wherein the DLL further includes a clock driving unit for receiving the internal clock, the DLL clock and the clock selection signal to generate a third clock.

5. A method of propagating a signal through a semiconductor memory device, comprising the steps of:
   providing an external clock;
   buffering the external clock;
   generating a delay locked loop (DLL) clock in substantial synchronization with the external clock;
   generating a DLL control signal and a clock selection signal by receiving a DLL signal, a DLL reset signal, a power-up signal, a self-refresh request signal and a self-refresh signal; and
   providing the DLL clock to a control signal buffer and an address buffer.

6. The method of claim 5 further comprising the step of providing the DLL clock to a CAS buffer.

7. The method of claim 5 further comprising the step of generating an internal control signal in substantial synchronization with the DLL clock in response to the DLL control signal.

8. The method of claim 7, wherein the step of generating the internal control signal is performed by the control signal buffer in response to receiving the DLL clock, an external control signal and the DLL control signal.

9. The method of claim 5 further comprising the step of generating an internal address signal in substantial synchronization with the DLL clock in response to the DLL control signal.

10. The method of claim 9, wherein the step of generating the internal address signal and DLL control signal.

11. The method of claim 8 further comprising the steps of:
    decoding the internal control signal; and
    generating a command signal in response to the step of decoding.

12. The method of claim 5, wherein the semiconductor memory device has an access time of less than 1.5 nanoseconds.

* * * * *

UNITED STATES PATENT AND TRADEMARK OFFICE
CERTIFICATE OF CORRECTION

PATENT NO. : 6,538,956 B2
DATED : March 25, 2003
INVENTOR(S) : Ryu et al.

It is certified that error appears in the above-identified patent and that said Letters Patent is hereby corrected as shown below:

<u>Column 6,</u>
Line 46, after "and" insert -- the --.
Line 46, after "internal address signal" insert -- is performed by the address buffer in response to receiving the DLL clock, an external address signal --.

Signed and Sealed this

Eleventh Day of November, 2003

JAMES E. ROGAN
*Director of the United States Patent and Trademark Office*